US009231588B2

(12) United States Patent
Trend et al.

(10) Patent No.: US 9,231,588 B2
(45) Date of Patent: Jan. 5, 2016

(54) TOUCHSCREEN ROUTING FLOW FOR SINGLE LAYER PATTERN

(71) Applicants: Matthew Trend, Hampshire (GB); Gareth Jones, Hampshire (GB); Patrick Cassidy, Hampshire (GB)

(72) Inventors: Matthew Trend, Hampshire (GB); Gareth Jones, Hampshire (GB); Patrick Cassidy, Hampshire (GB)

(73) Assignee: Atmel Corporation, San Jose, CA (US)

( * ) Notice: Subject to any disclaimer, the term of this patent is extended or adjusted under 35 U.S.C. 154(b) by 228 days.

(21) Appl. No.: 13/873,979

(22) Filed: Apr. 30, 2013

(65) Prior Publication Data

US 2014/0320199 A1 Oct. 30, 2014

(51) Int. Cl.
*G06F 3/044* (2006.01)
*H03K 17/96* (2006.01)

(52) U.S. Cl.
CPC ............ *H03K 17/9622* (2013.01); *G06F 3/044* (2013.01); *H03K 2217/960775* (2013.01)

(58) Field of Classification Search
CPC .................. G06F 3/044; H03K 2217/960775; H03K 17/9622
USPC ........................................................ 345/174
See application file for complete search history.

(56) References Cited

U.S. PATENT DOCUMENTS

| 7,663,607 | B2 | 2/2010 | Hotelling | |
|---|---|---|---|---|
| 7,875,814 | B2 | 1/2011 | Chen | |
| 7,920,129 | B2 | 4/2011 | Hotelling | |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,179,381 | B2 | 5/2012 | Frey | |
| 2004/0080486 | A1* | 4/2004 | Troxell et al. | 345/156 |
| 2009/0315854 | A1 | 12/2009 | Matsuo | |
| 2011/0134056 | A1* | 6/2011 | Kim et al. | 345/173 |
| 2011/0210934 | A1* | 9/2011 | Lee et al. | 345/173 |
| 2012/0026122 | A1* | 2/2012 | Simmons | 345/174 |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.
U.S. Appl. No. 61/454,950, filed Mar. 21, 2011, Lynch.

(Continued)

*Primary Examiner* — Ariel Balaoing
(74) *Attorney, Agent, or Firm* — Baker Botts L.L.P.

(57) ABSTRACT

A touch sensor comprising a plurality of first electrode lines along a first direction, each of the first electrode lines comprising a plurality of first electrodes; a plurality of second electrode lines along a second direction that is substantially perpendicular to the first direction, each of the second electrode lines comprising one second electrode, the one second electrode of each of the second electrode lines being interdigitated with one of the first electrodes of each of the first electrode lines, the first and second electrodes being disposed on a first side of a substrate; and a plurality of bond pads disposed on the first side of the substrate, wherein at least one bond pad of the plurality of bond pads is coupled to at least two of the first electrodes of the plurality of first electrodes.

23 Claims, 9 Drawing Sheets

(56) References Cited

U.S. PATENT DOCUMENTS

2013/0037330 A1* 2/2013 Singh .................... 178/18.06
2013/0076612 A1   3/2013 Myers

OTHER PUBLICATIONS

U.S. Appl. No. 61/454,894, filed Mar. 21, 2011, Rothkopf.
U.S. Appl. No. 13/278,046, filed Oct. 20, 2011, Yilmaz.

* cited by examiner

TOUCHSCREEN ROUTING FLOW FOR SINGLE LAYER PATTERN

TECHNICAL FIELD

This disclosure generally relates to touch sensors.

BACKGROUND

An array of conductive drive and sense electrodes may form a mutual-capacitance touch sensor having one or more capacitive nodes. The mutual-capacitance touch sensor may have either a two-layer configuration or single-layer configuration. In a single-layer configuration, drive and sense electrodes may be disposed in a pattern on one side of a substrate. In such a configuration, a pair of drive and sense electrodes capacitively coupled to each other across a space or dielectric between electrodes may form a capacitive node.

In a single-layer configuration for a self-capacitance implementation, an array of vertical and horizontal conductive electrodes may be disposed in a pattern on one side of the substrate. Each of the conductive electrodes in the array may form a capacitive node, and, when an object touches or comes within proximity of the electrode, a change in self-capacitance may occur at that capacitive node and a controller may measure the change in capacitance as a change in voltage or a change in the amount of charge needed to raise the voltage to some pre-determined amount.

In a touch-sensitive display application, a touch screen may enable a user to interact directly with what is displayed on a display underneath the touch screen, rather than indirectly with a mouse or touchpad. A touch screen may be attached to or provided as part of, for example, a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch screen.

DESCRIPTION OF EXAMPLE EMBODIMENTS

Figure 1:
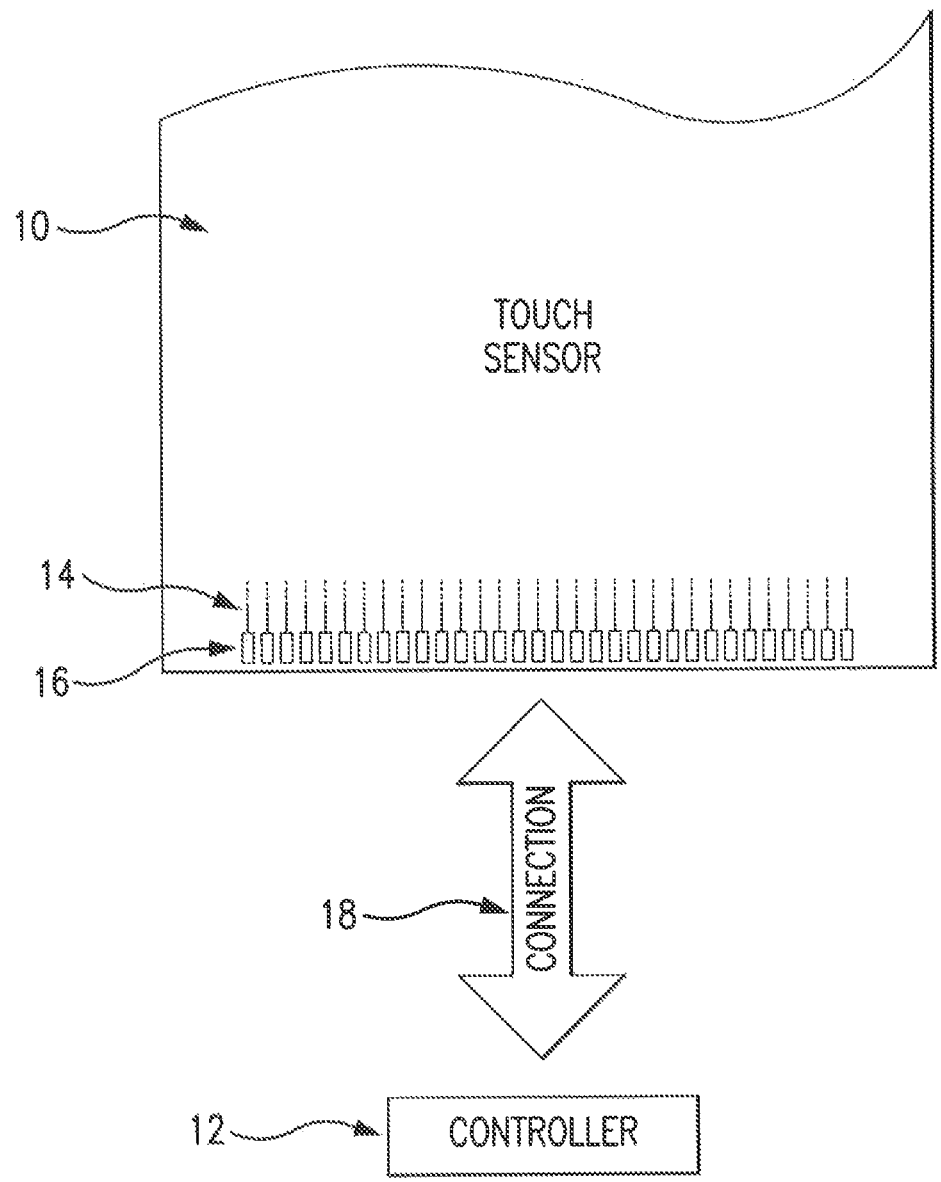
FIG. 1 illustrates a touch sensor and touch sensor controller in accordance with particular embodiments.

FIG. 1 illustrates a touch sensor and touch sensor controller in accordance with particular embodiments. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the controller and its touch sensor, where appropriate. Touch sensor 10 may include one or more touch-sensitive areas, or sensing areas, where appropriate. Touch sensor 10 may include an array of drive and sense electrodes (illustrated in FIGS. 2 through 5A, 5B, and 5C) or an array of electrodes of a single type disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, quadrilateral, other suitable shape, or suitable combination of these shapes. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% (such as for example, approximately 5%) of the area of its shape. As an example and not by way of limitation, an electrode may be made of fine lines of metal or other conductive material (such as for example copper, silver, or a copper- or silver-based material) and the fine lines of conductive material may occupy substantially less than 100% (such as for example, approximately 5%) of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more macro-features of a touch sensor may determine one or more characteristics of its functionality. One or more characteristics of the implementation of those shapes (such as, for example, the conductive materials, fills, or patterns within the shapes) may constitute in whole or in part one or more micro-features of the touch sensor. One or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of optically clear adhesive may be disposed between the cover panel and the substrate with the conductive material forming the drive or sense electrodes. The mechanical stack may also include a second layer of optically clear adhesive and a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of optically clear adhesive and the dielectric layer. The second layer of optically clear adhesive may be disposed between the substrate with the conductive material making up the drive or sense electrodes and the dielectric layer, and the dielectric layer may be disposed between the second layer of optically clear adhesive and an air gap to a display of a device including touch sensor 10 and touch-sensor controller 12. As an example only and not by way of limitation, the cover panel may have a thickness of approximately 1 mm; the first layer of optically clear adhesive may have a thickness of approximately 0.05 mm; the substrate with the conductive material forming the drive or sense electrodes may have a thickness of approximately 0.05 mm; the second layer of optically clear adhesive may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of optically clear adhesive, and air gap described above, with there being no air gap to the display.

One or more portions of the substrate of touch sensor 10 may be made of PET or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. In certain embodiments, the fine lines of metal may be configured in a mesh formation. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node, and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) or digital signal processors (DSPs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs)—such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. In particular embodiments, multiple touch-sensor controllers 12 are disposed on the FPC. In some embodiments, the FPC may have no touch-sensor controllers 12 disposed on it. The FPC may couple touch sensor 10 to a touch-sensor controller 12 located elsewhere, such as for example, on a printed circuit board of the device. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

The substrate of touch sensor 10 includes tracks 14 of conductive material disposed on the substrate. Tracks 14 may couple the drive or sense electrodes of touch sensor 10 to bond pads 16, also disposed on the substrate of touch sensor 10. As described herein, bond pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (similar to bond pad 16) at an edge of the substrate of touch sensor 10 (similar to tracks 14).

Bond pads 16 may be located along one or more edges of the substrate, outside the touch-sensitive area(s) of touch sensor 10. As described above, touch-sensor controller 12 may be on an FPC. Bond pads 16 may be made of the same material as tracks 14 and may be bonded to the FPC using an anisotropic conductive film (ACF). Connection 18 may include conductive lines on the FPC coupling touch-sensor controller 12 to bond pads 16, in turn coupling touch-sensor controller 12 to tracks 14 and to the drive or sense electrodes of touch sensor 10. In another embodiment, bond pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

In particular embodiments, touch sensor 10 may have a configuration where multiple drive electrodes are connected to one bond pad 16. In one embodiment, a first drive electrode is coupled to a first track 14, and a second drive electrode is coupled to a second track 14. Both the first track 14 and second track 14 are coupled to one bond pad 16, which in turn is coupled to touch-sensor controller 12. In certain embodiments, electrode connectors couple drive electrodes to tracks 14. Electrode connectors may be configured in a variety of ways. For example, in various embodiments, electrode connectors may extend generally in parallel to columns of drive electrodes or may extend generally at an angle with respect to columns of drive electrodes. Particular embodiments and examples of bond pad, track, and/or electrode connector configurations will be discussed further with respect to FIGS. 2 through 5A, 5B, and 5C.

Figure 2:
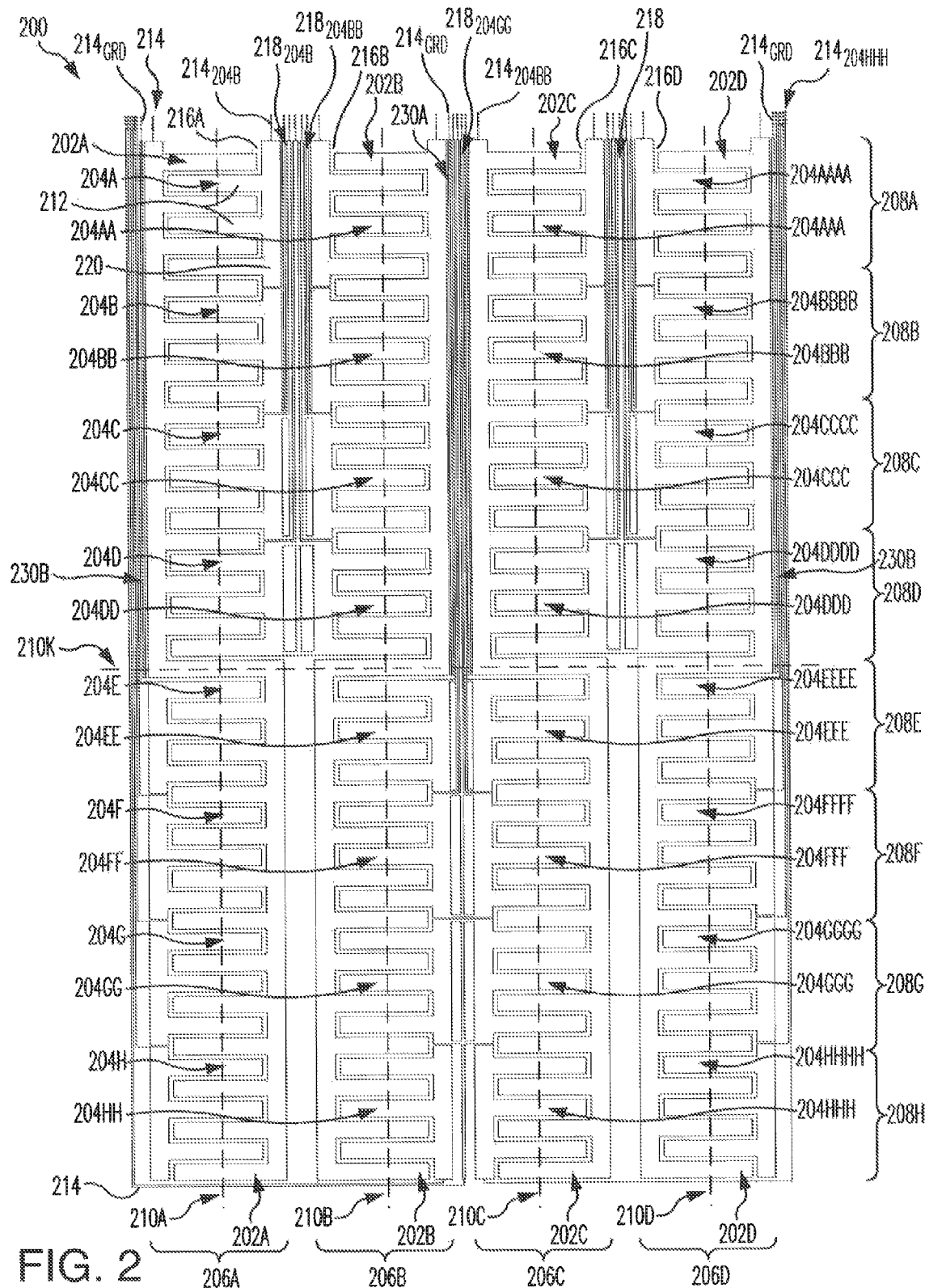
FIG. 2 illustrates a single-layer touch sensor configuration for use in a touch sensor in accordance with particular embodiments of the disclosure.

FIG. 2 illustrates a single-layer touch sensor configuration for use in touch sensor 10 in accordance with particular embodiments. Configuration 200 includes an array of sense electrodes 202A-202D and drive electrodes 204A-204HHHH defining a touch-sensitive area of touch sensor 10.

Columns 206A-206D of the array each include a sense electrode 202A-202D extending along an axis 210A-210D corresponding to the column of the array and one or more drive electrodes 204A-204HHHH each disposed in parallel and adjacent to corresponding sense electrode 202A-202D. For example, column 206A includes sense electrode 202A and corresponding drive electrodes 204A-204H disposed along axis 210A. Rows 208A-208H of the array are substantially perpendicular to columns 206A-206D and include a portion of each sense electrode 202A-202D and four of a plurality drive electrodes 204A-204HHHH. For example, row 208A includes sense electrodes 202A-202D and drive electrodes 204A, 204AA, 204AAA, and 204AAAA. Each sense electrode 202A-202D may be capacitively coupled to one or more adjacent drive electrodes 204A-204HHHH within its respective column 206A-206D. Sense electrodes 202A-202D do not make electrical contact with adjacent drive electrodes 204A-204HHHH, and instead are separated by one of a plurality of gaps 216A-216D.

In configuration 200, each sense electrode 202A-202D is continuous along axis 210A-210D, respectively. Axes 210A-210D divide each column of touch sensor 20 approximately into halves. In addition, touch-sensitive area of touch sensor 10 may be approximately divided into a top half and bottom half about an axis 210K. Each sense electrode 202A-202D may be routed along one side of axes 210A-210D in the touch-sensitive area above axis 210K. Below axis 210K, each sense electrode 202A-202D may be flipped about axes 210A-210D, such that each sense electrode 202A-202D may be routed on an opposite side relative to axes 210A-210D. As an example and not by way of limitation, above axis 210K, sense electrode 202A may be routed left of axis 210A. Below axis 210K, sense electrode 202A may flipped about and routed right of axis 210A. Above axis 210K, corresponding drive electrodes 204A-2041) may be located right of axis 210A. Below axis 210K, corresponding drive electrodes 204E-204H may be located left of axis 210A. In various embodiments, axis 210K may be located at any point along axes 210A-210D, higher or lower than illustrated, and may divide the touch sensitive area into a top portion and a bottom portion about the axis.

Portions of sense electrodes 202A-202D in one column are adjacent to portions of sense electrodes 202A-202D in an adjacent column and drive electrodes 204A-204HHHH in one column are adjacent to drive electrodes 204A-204HHHH in an adjacent column. As an example and not by way of limitation, sense electrode 202B is adjacent to sense electrode 202C above axis 210K; and drive electrodes 204EE, 204FF, 204GG, and 2040HH are adjacent to 204EEE, 204FFF, 204GGG, and 204HHH, respectively, below axis 210K. In other words, for a given column the electrode configuration above axis 210K may be a mirror image of the electrode configuration below axis 210K.

Each sense electrode 202A-202D and drive electrode 204A-204HHHH includes a plurality of projections 212 extending from one side of a main electrode portion 220. Projections 212 of each sense electrode 202A-202D may be adjacent to projections 212 of corresponding drive electrode 204A-204HHHH so as to form capacitive coupling edges separated by gaps 216A-216D. Projections 212 may be interleaved or interdigitated to increase the number of capacitive coupling edges between a sense electrode and one or more corresponding drive electrodes. For example, in column 206A projections 212 of sense electrode 202A are interdigitated with projections 212 of corresponding drive electrodes 204A-204H separated by gap 216A. In particular embodiments, capacitive coupling between sense electrodes and corresponding drive electrodes may be determined by the dimensions of gaps 216A-216D and/or the edges of projections 212 of the sense and/or drive electrodes.

Each sense electrode 202A-202D and drive electrode 204A-204HHHH includes an area of conductive material forming a shape, which in this embodiment includes projections 212. In particular embodiments, the shape may be any suitable shape, includes, for example, a disc, square, rectangle, or suitable combination of these. In particular embodiments, the conductive material of an electrode may occupy approximately 100%, approximately 50%, approximately 10%, approximately 5%, or any suitable percentage of the area of its shape. As an example and not by way of limitation, sense and drive electrodes, 202A and 204A, along with corresponding electrode connectors 218 may be made of indium tin oxide (ITO) and the ITO may occupy approximately 100% of the area of each shape, where appropriate. As another example, sense and drive electrodes, 202A and 204A, along with corresponding electrode connectors 218 may be made of ITO and the ITO may occupy approximately 50% of the area of each shape. In certain embodiments, the ITO may be in a hatched or other suitable pattern. As another example, sense and drive electrodes 202A and 204A, along with corresponding electrode connectors 218 may be made of fine lines of metal (FLM), e.g., copper, silver, or a copper- or silver-based material, and the FLM may occupy approximately 5% of the area of each shape. In particular embodiments, the FLM may be in a hatched or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes or the means of electrically isolating or physically separating the shapes from each other) may constitute in whole or in part one or more micro-features of the touch sensor.

Sense electrodes 202A-202D and drive electrodes 204A-204HHHH of the array are coupled to tracks 214 through electrode connectors 218. Electrode connectors 218 extend from the main portion 220 of each drive electrode and couple drive electrodes 204A-204HHHH to tracks 214. For ease of reference, the electrode connector 218 that couples drive electrode 204B to its corresponding track 214, may be referred to as electrode connector $218_{204B}$ and the track may be referred to as track $214_{204B}$. Other electrode connectors 218, tracks 214, and other components may be similarly referenced. As an example and by not way of limitation, electrode connector $218_{204BB}$ couples drive electrode 204BB to corresponding tracks $214_{204BB}$. In certain embodiments, sense electrodes 202A-202D, drive electrodes 204A-204HHHH, and electrode connectors are formed using a single conductive layer. In particular embodiments, some electrode connections of drive electrodes 204A-204HHHH may be routed to a top of the array, while a remainder of drive electrodes 204A-204HHHH may be routed to tracks 214 through a bottom of the array. As an example and not by way of limitation, electrode connection $218_{204BB}$ of drive electrode 204BB may be routed through the top of the array, while drive electrode 204HHH may be coupled to corresponding track $214_{204HHH}$ through a bottom of the array. As described above, electrode connectors of drive electrodes may be coupled together with a connection (not shown) outside the touch-sensitive area to define rows of the array. In various embodiments, tracks 214 may be located on a different vertical level than electrode connectors. As described in conjunction with FIG. 1, the controller receives sensing signals from sense electrodes 202A-202D and transmits drive signals to drive electrodes 204A-204HHHH through tracks 214 to determine the position of the object adjacent touch sensor 10.

Each track 214 couples the corresponding electrode to a bond pad (not illustrated), which allows effective communication between electrodes and the touch sensor controller, but requires a fixed amount of space along one or more peripheries of touch sensor 10. Particular embodiments recognize that it is possible to connect multiple tracks 214 to a single bond pad, thus effectively allowing multiple drive electrodes to share one bond pad. FIGS. 3A, 3B, 4A, 4C, 5A, 5B, and 5C illustrate multiple embodiments of this approach. Allowing multiple electrodes to be coupled to a single bond pad may allow for a reduction in the required space along the periphery of a touch screen and/or within the touch-sensitive area the touch screen, may provide for economic benefits associated with a reduction in the number of required bond pads, and/or may provide other logistical, manufacturing, environmental, and economic benefits.

A ground shape 230A extends along an axis parallel to axes 210A-210D and separates sense electrode 202B and adjacent electrode connections, including, for example, electrode connection $218_{204EE}$ of drive electrode 204EE. Ground shapes 230B extend along axes parallel to axes 210A-210D and separate sense electrodes 202A and 202D from adjacent tracks. Ground shapes are coupled to corresponding ground tracks $214_{GRD}$. Ground shape 230A serves to suppress unintentional capacitive coupling between adjacent electrodes and electrode connections. Ground shapes 230A-230B provide "fill in" or cover space within the array that may otherwise remain unoccupied. In particular embodiments, the optical properties of gaps, such as gaps 216A-216D, and/or voids within other areas of the array with large dimensions relative to feature sizes of sense and drive electrodes may be different than the optical properties of the array's electrodes. Optical discontinuities may occur when viewing a display underneath touch sensor 10 due to these differences in optical properties. Gaps and voids within other areas of the array be substantially filled using a ground shape, similar to ground shapes 230A-230B, or "in-fill" material so as to reduce the number of areas with optical discontinuities. Using ground shapes 230A-230B in this manner may improve the optical properties of touch sensor 10. Further, isolated ground shapes may serve to visually obscure a pattern of sense and drive electrodes, while having a minimal impact on the fringing fields between adjacent electrodes. In various embodiments, ground shapes and in-fill shapes may be formed during manufacture and using the same process steps as sense electrodes 202A-202D and drive electrodes 204A-204HHHH, such that in-fill shapes may be formed from the same material and may have substantially the same thickness and electrical properties as sense electrodes 202A-202D and drive electrodes 204A-204HHHH. In certain embodiments, there may be any number of ground shapes or in-fill shapes in the interior of the array or along one or more peripheries of the array.

Figure 3A:
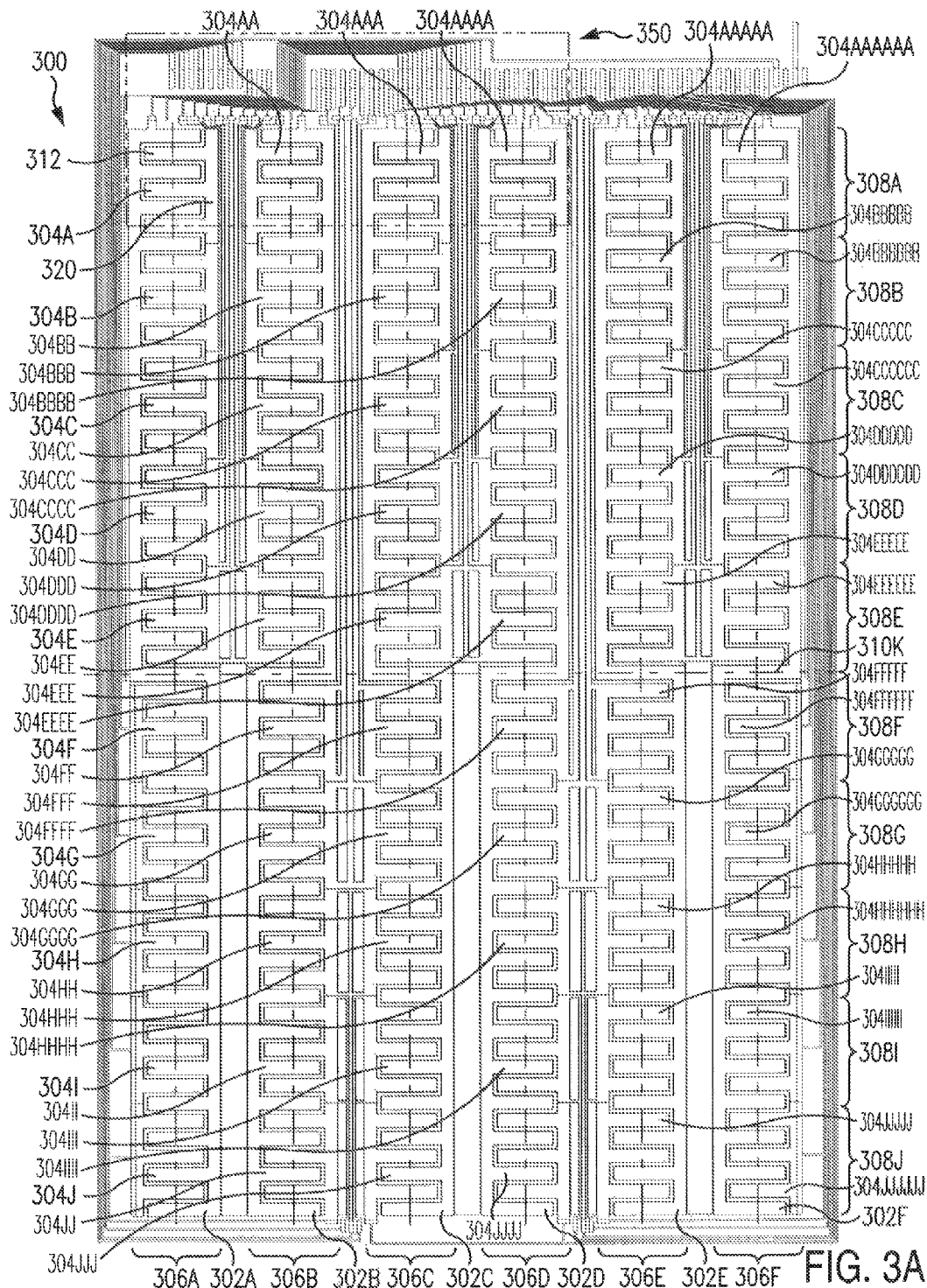
FIGS. 3A and 3B illustrates another single-layer touch sensor configuration for use in a touch sensor in accordance with particular embodiments of the disclosure.
Figure 3B:
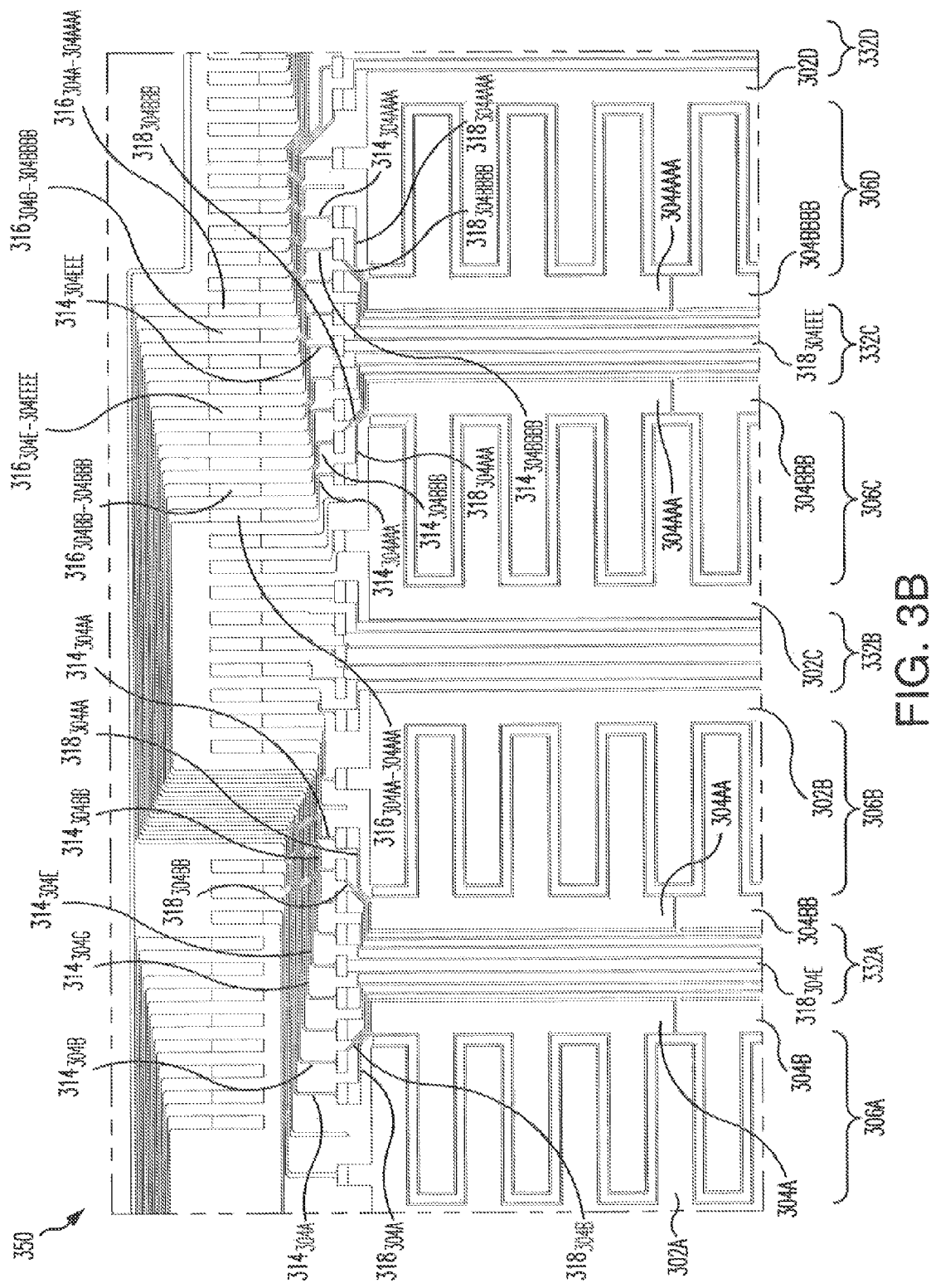

FIGS. 3A and 3B illustrate another single-layer touch sensor configuration for use in touch sensor 10 in accordance with particular embodiments of the disclosure. FIG. 3A illustrates configuration 300, which includes an array of sense electrodes 302A-302F and drive electrodes 304A-304JJJJJ defining a touch-sensitive area of touch sensor 10. Sense electrodes 302A-302F and 304A-304JJJJJ are arranged in columns 306A-306F and rows 308A-308J, similar to the rows and columns described in conjunction with FIG. 2. Each sense electrode 302A-302F extends along a respective axis 310A-310F. In addition, touch-sensitive area of touch sensor 10 may be approximately divided into a top half and a bottom half about axis 310K. Each sense electrode 302A-302F is routed along one side of respective axis 310A-310F in the touch-sensitive area above axis 310K. Below axis 310K, each sense electrode 302A-302F may be flipped about axes 310A-310D, such that each sense electrode 302A-302F is routed on an opposite side relative to respective axis 310A-310F. As an example and not by way of limitation, above axis 310K, sense electrode 302A may be routed left of axis 310A. Below axis 310K, sense electrode 302A may be flipped about and routed right of axis 310A. Above axis 310K, corresponding drive electrodes 304A-304E may be located right of axis 310A. Below axis 310K, corresponding drive electrodes 304F-304J may be located left of axis 310A. In various embodiments, axis 310K may be located along any point, higher or lower than illustrated, along axes 310A-310F. Each sense electrode 302A-302F and drive electrode 304A-304JJJJJ includes a main portion 320 and a plurality of projections 312, or digits, extending from the main portion. In configuration 300, projections 312 of adjacent drive and sense electrodes are interleaved or interdigitated. For example, projections 312 on the portion of sense electrode 302A adjacent to drive electrode 304A are interdigitated with projections 312 of drive electrode 304A. Additional components of touch screen 10 illustrated in FIG. 3A will be discussed in conjunction with FIG. 3B.

FIG. 3B illustrates section 350 on a larger scale. Section 350 illustrates portions of sense electrodes 302A, 302B, 302C, and 302D), drive electrodes 304A, 304AA, 304AAA, and 304AAAA, portions of drive electrodes 304B, 304BB, 304BBB, and 304BBBB, tracks 314, and bond pads 316. Drive electrode 304A is coupled to track $314_{304A}$ by electrode connector $318_{304A}$. Track $314_{304A}$ couples drive electrode 304A to bond pad $316_{304A-304AAAA}$. Drive electrode 304AAAA is coupled to track $314_{304AAAA}$ by electrode connector $318_{304AAAA}$. Track $314_{304AAAA}$ couples drive electrode 304AAAA to bond pad $316_{304A-304AAAA}$. Track $314_{304A}$ connects to bond pad $316_{304A-304AAAA}$ at an entry point on one side of the bond pad and track $314_{304AAAA}$ connects at an entry point on an opposite side of the bond pad. In certain embodiments, the entry points may be located on the same side or adjacent sides of the bond pad. Bond pad $316_{304A-304AAAA}$ serves to couple both drive electrodes 304A and 304AAAA to the touch sensor controller. Other drive electrodes in column 306A also share bond pads with drive electrodes in column 306D. For example, drive electrode 304B is coupled to track $314_{304B}$ by electrode connector $318_{304B}$. Track $314_{304B}$ couples drive electrode 304B to bond pad $316_{304B-304BBBB}$. Drive electrode 304BBBB is coupled to track $314_{304BBBB}$ by electrode connector $318_{304BBBB}$. Track $314_{304BBBB}$ couples drive electrode 304BBBB to bond pad $316_{304B-304BBBB}$. Track $314_{304B}$ connects to bond pad $316_{304B-304BBBB}$ at an entry point on one side of the bond pad and track $314_{304BBBB}$ connects at an entry point on an opposite side of the bond pad. In certain embodiments, the entry points may be located on the same side or adjacent sides of the bond pad. Bond pad $316_{304B-304BBBB}$ serves to couple both drive electrodes 304B and 304BBBB to the touch sensor controller. In particular embodiments, all, some, or none of the drive electrodes in a column may share a bond pad with a drive electrode in a different column.

Drive electrodes from other columns also share bond pads. Drive 304AA is coupled to track $314_{304AA}$ by electrode connector $318_{304AA}$. Track $314_{304AA}$ couples drive electrode 304AA to bond pad $316_{304AA-304AAA}$. Drive electrode 304AAA is coupled to track $314_{304AAA}$ by electrode connector $318_{304AAA}$. Track $314_{304AAA}$ couples drive electrode 304AAA to bond pad $316_{304AA-304AAA}$. Track $314_{304AA}$ connects to bond pad $316_{304AA-304AAA}$ at an entry point on one side of the bond pad and track $314_{304AAA}$ connects at an entry point on an opposite side of the bond pad. In certain embodiments, the entry points may be located on the same side or adjacent sides of the bond pad. Bond pad $316_{304AA-304AAA}$ serves to couple both drive electrodes 304AA and 304AAA to the touch sensor controller. Other drive electrodes in column 306B also share bond pads with drive electrodes in column 306C. For example, drive electrode 304BB is coupled to track $314_{304BB}$ by electrode connector $318_{304BB}$. Track $314_{304BB}$ couples drive electrode 304BB to bond pad $316_{304BB-304BBB}$. Drive electrode 304BBB is coupled to track $314_{304BBB}$ by electrode connector $318_{304BBB}$. Track $314_{304BBB}$ couples drive electrode 304BBB to bond pad $316_{304BB-304BBB}$. Track $314_{304BB}$ connects to bond pad $316_{304BB-304BBB}$ at an entry point on one side of the bond pad and track $314_{304BBB}$ connects at an entry point on an opposite side of the bond pad. In certain embodiments, the entry points may be located on the same side or adjacent sides of the bond pad. Bond pad $316_{304BB-304BBB}$ serves to couple both drive electrodes 304BB and 304BBB to the touch sensor controller.

Bond pads 316 may be shared by more than two drive electrodes. Drive electrode 304E in column 306A (not illustrated in FIG. 3B) is coupled to track $314_{304E}$ by electrode connector $318_{304E}$. Track $314_{304E}$ couples drive electrode 304E to bond pad $316_{304E-304EEEE}$. Drive electrode 304EE in column 306B (not illustrated in FIG. 3B) is also coupled to track $314_{304E}$ by electrode connector $318_{304E}$. This configuration will be discussed further in conjunction with FIGS. 5A-C. Drive electrode 304EEE in column 306C (not illustrated in FIG. 3B) is coupled to track $314_{304EEE}$ by electrode connector $318_{304EEE}$ Track $314_{304EEE}$ couples drive electrode 304EEE to bond pad $316_{304E-304EE}$. Drive electrode 304EEEE in column 306D (not illustrated in FIG. 3B) is also coupled to track $314_{304EEE}$ by electrode connector $318_{304EEE}$. Track $314_{304E}$ connects to bond pad $316_{304E-304EEEE}$ at an entry point on one side of the bond pad and track $314_{304EEE}$ connects at an entry point on an opposite side of the bond pad. In certain embodiments, the entry points may be located on the same side or adjacent sides of the bond pad. Bond pad $316_{304E-304EEEE}$ serves to couple both drive electrodes 304E, 304EE, 304EEE, and 304EEEE to the touch sensor controller. In particular embodiments, any number of drive electrodes may utilize, or share, one bond pad, including any even or odd number of drive electrodes, coupled to the single bond pad through independent or shared electrode connectors.

The space between columns of the array includes channels 332A-332D (channel 332D is only partially visible). Channels may be filled with electrode connectors, for example, channel 332A is filled in part by electrode connectors $318_{304A}$, $318_{304B}$, and $318_{304E}$. In particular embodiments, channels 332A-332D may also or alternatively include ground shapes or in-fill shapes, similar to the shapes discussed in conjunction with FIGS. 2, 5B and 5C. In certain embodiments, each drive electrode connected to an electrode connector extending through or near one channel may share a bond pad with a second drive electrode connected to an electrode connector extending through or near the same channel or may share a bond pad with a second drive electrode connected to an electrode connector extending through or near a second channel. In various embodiments, some or none of the drive electrodes with electrode connectors extending through or near a channel will share a bond bad. Particularly in configurations where multiple drive electrodes are connected to one electrode connector, the width of the channel between columns may be reduced, which may allow for greater space within the touch-sensitive area of touch sensor 10 for electrodes and/or may improve performance of touch sensor 10.

Allowing multiple drive electrodes to communicate with touch sensor controller through a single bond pad may also create space efficiencies and/or may reduce the amount of space required outside the touch-sensitive area of touch sensor 10, which may allow for the expansion of the touch-sensitive area within a given application or may allow for the reduction in non-touch-sensitive areas required in a given application. Reducing the number of bond pads may reduce flex size. Additionally or alternatively, reducing the number of required bond pads may provide economic benefits during the procurement of parts for and/or the manufacturing of touch sensor 10.

Figure 4A:
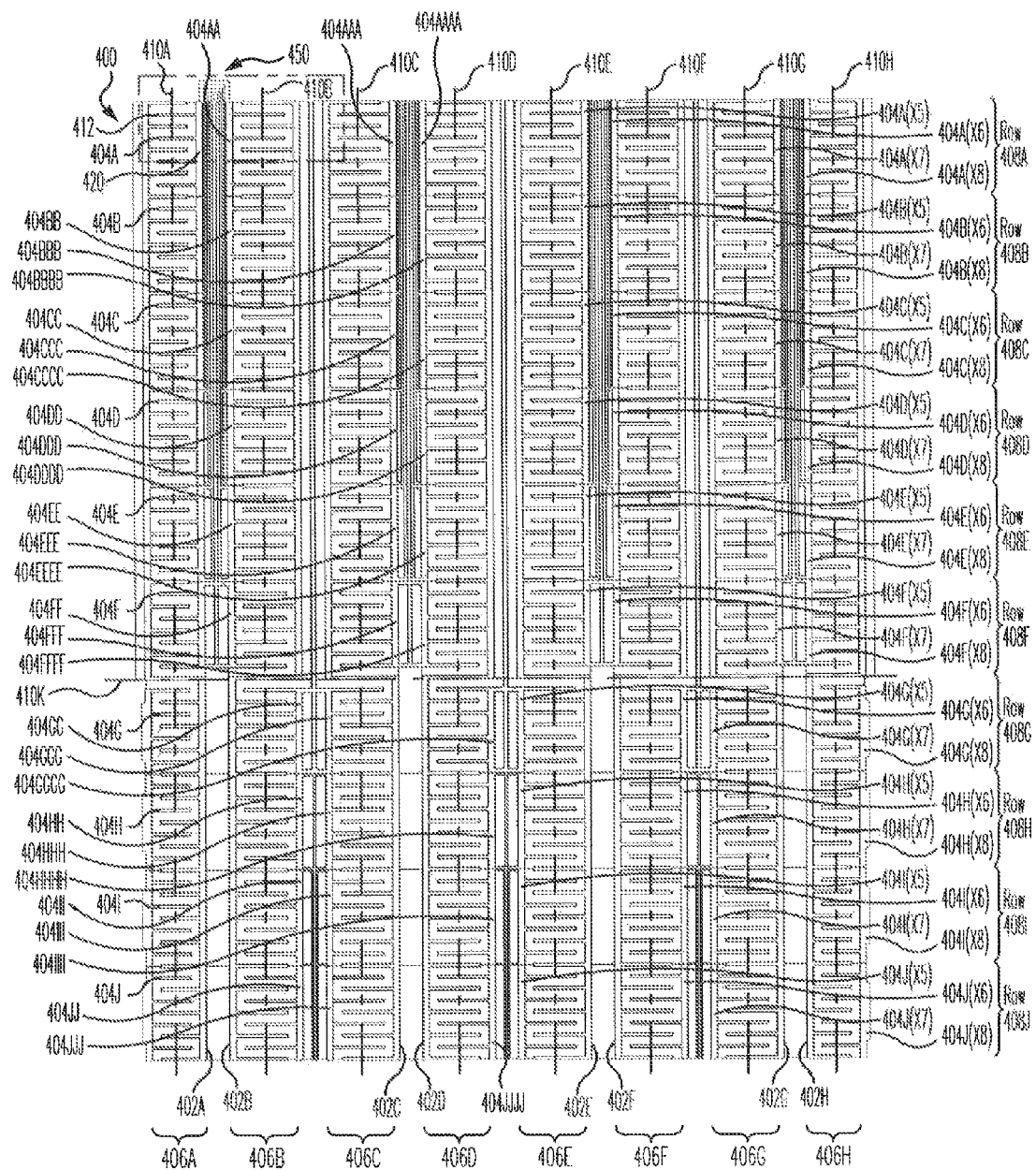
FIGS. 4A and 4B illustrate another single-layer touch sensor configuration for use in a touch sensor in accordance with particular embodiments of the disclosure.
Figure 4B:
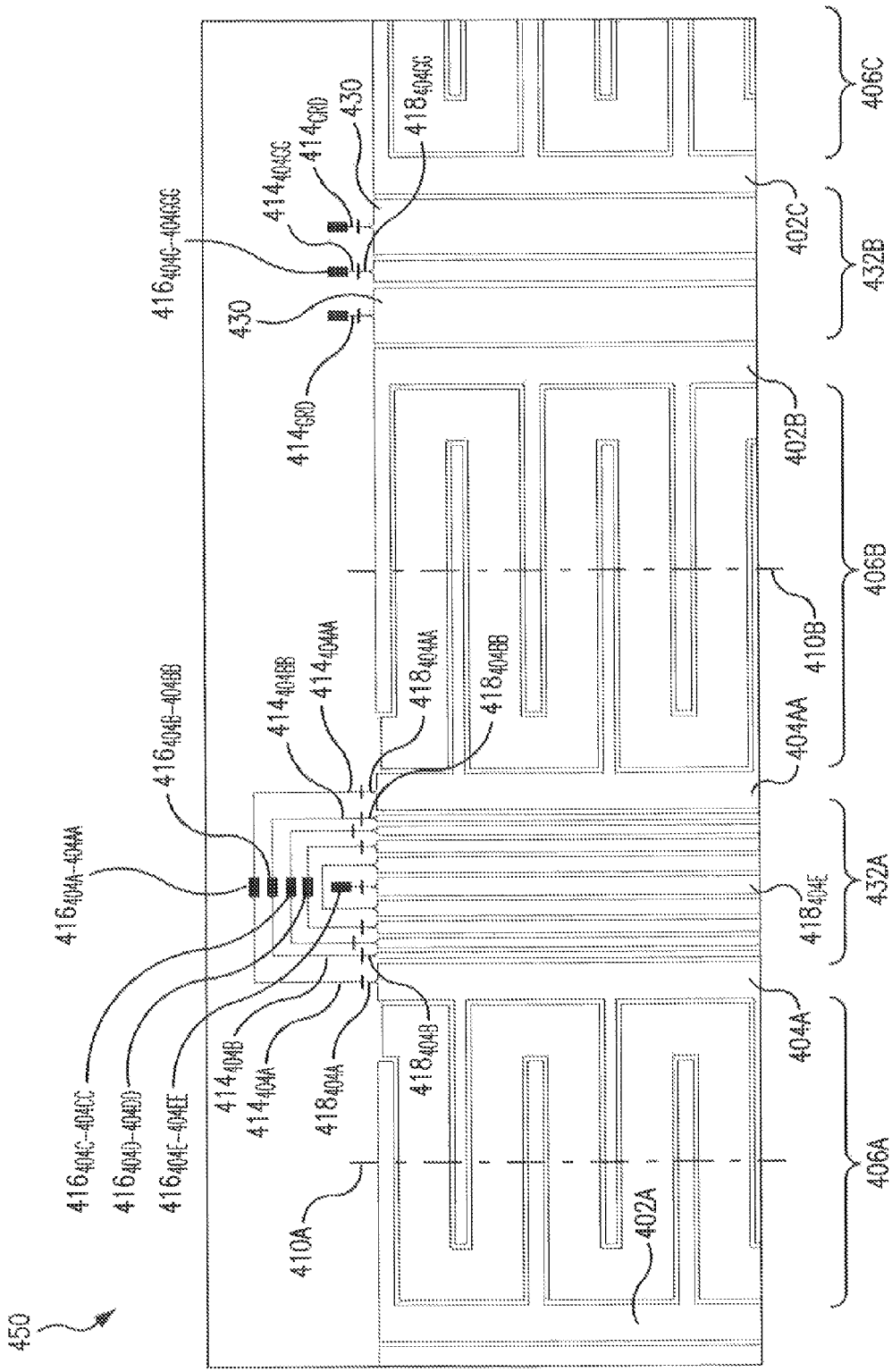

FIGS. 4A and 4B illustrate another single-layer touch sensor configuration for use in touch sensor 10 in accordance with particular embodiments of the disclosure. FIG. 4A illustrates configuration 400, which includes an array of sense electrodes 402A-402H and drive electrodes 404A-404JJJJJJ defining a touch-sensitive area of touch sensor 10. For purposes of illustration, drive electrodes may be labeled with an "X n" where n is the number of reference letters. For example, electrode 404AAAAA may be labeled as 404A(×5), 404AAAAAA as 404A(×6), 404AAAAAAA as 404A(×7), and 404AAAAAAAA as 404A(×8). Sense electrodes 402A-402H and 404A-404JJJJJJ are arranged in columns 406A-406H and rows 408A-408J, similar to the rows and columns described in conjunction with FIGS. 2 and 3A. Each sense electrode 402A-402H extends along a respective axis 410A-410H. In addition, the touch-sensitive area of touch sensor 10 may be approximately divided into a top half and a bottom half about axis 410K. Each sense electrode 402A-402H is routed along one side of respective axis 410A-410F in the touch-sensitive area above axis 410K. Below axis 410K, each sense electrode 402A-402H may be flipped about axes 410A-410H, such that each sense electrode 402A-402H is routed on an opposite side relative to respective axis 410A-410H. As an example and not by way of limitation, above axis 410K, sense electrode 402A may be routed left of axis 410A. Below axis 410K, sense electrode may be flipped about and routed right of axis 410A. Above axis 410K, corresponding drive electrodes 404A-404F may be located right of axis 410A. Below axis 410K, corresponding drive electrodes 404G-404J may be located left of axis 410K. In particular embodiments, axis 410K may be located at any point, higher or lower than illustrated, along axes 410A-410H. Each sense electrode 402A-402H and drive electrode 404A-404JJJJJJ includes a main portion 420 and a plurality of projections 412, or digits, extending from the main portion. In configuration 400, projections 412 of adjacent drive and sense electrodes are interleaved, or interdigitated. For example, projections 412 on the portion of sense electrode 402A adjacent to drive electrode 404A are interdigitated with projections 412 of drive electrode 404A. Projections 412 extend from each main portion 420 of drive electrodes 404A-404JJJJJJ on one side of main portion 420. Additional components of touch screen 10 illustrated in FIG. 4A will be discussed in conjunction with FIG. 4B.

FIG. 4B illustrates section 450 on a larger scale. Section 450 illustrates portions of sense electrodes 402A, 402B, 402C, and portions of drive electrodes 404A and 404AA, which are interdigitated with sense electrodes 402A and 402B, respectively.

Drive electrode 404A is coupled to track $414_{404A}$ by electrode connector $418_{404A}$. Track $414_{404A}$ couples drive electrode 404A to bond pad $416_{404A-404AA}$. Drive electrode 404AA is coupled to track $414_{404AA}$ by electrode connector $418_{404AA}$. Track $414_{404AA}$ couples drive electrode 404AA to bond pad $416_{404A-404AA}$. Track $414_{404A}$ connects to bond pad $416_{404A-404AA}$ at an entry point on one side of the bond pad and track $414_{404AA}$ connects at an entry point on an opposite side of the bond pad. In certain embodiments, the entry points may be located on the same side or adjacent sides of the bond pad. Bond pad $416_{404A-404AA}$ serves to couple both drive electrodes 404A and 404AA to the touch sensor controller. Other drive electrodes in column 406A also share bond pads with drive electrodes in column 406B. For example, drive electrode 404B (not illustrated in FIG. 4B) is coupled to track $414_{404B}$ by electrode connector $418_{404B}$. Track $414_{404B}$ couples drive electrode 404B to bond pad $416_{404B-404BB}$. Drive electrode 404BB (not illustrated in FIG. 4B) is coupled to track $414_{404BB}$ by electrode connector $418_{404BB}$. Track $414_{404BB}$ couples drive electrode 404BB to bond pad $416_{404B-404BB}$. Track $414_{404B}$ connects to bond pad $416_{404B-404BB}$ at an entry point on one side of the bond pad and track $414_{404BB}$ connects at an entry point on an opposite side of the bond pad. In certain embodiments, the entry points may be located on the same side or adjacent sides of the bond pad. Bond pad $416_{404B\text{-}404BB}$ serves to couple both drive electrodes 404B and 404BB to the touch sensor controller. Similarly, bond pad $416_{404C\text{-}404CC}$ couples both drive electrodes 404C and 404CC (not illustrated in FIG. 4B) and bond pad $416_{404D\text{-}404DD}$ couples both drive electrodes 404D and 404DD (not illustrated in FIG. 4B) to the touch sensor controller. Drive electrodes 404E and 404EE (not illustrated in FIG. 4B) are coupled to bond pad $416_{404E\text{-}404EE}$ by electrode connector $418_{404E}$ and track $414_{404E}$; bond pad $416_{404E\text{-}404EE}$ couples both drive electrodes 404E and 404EE to the touch sensor 10.

Unlike drive electrodes 404AA and 404BB, which are connected to electrode connectors $318_{404AA}$ and $318_{404BB}$ that move toward the top of touch sensor 10 through channel 432A, drive electrode 404GG (not illustrated in FIG. 4B) is connected to electrode connector $418_{404GG}$ that moves to the top of touch screen 10 through channel 432B. Drive electrodes 404GG is coupled to bond pad $416_{404GG\text{-}404GGG}$ by electrode connector $418_{404GG}$ and track $414_{404GG}$. Drive electrode 404GGG (not illustrated in FIG. 4B) is also connected to electrode connector $318_{404GG}$ in channel 432B. Thus, bond pad $416_{404GG\text{-}404GGG}$ couples both drive electrodes 404G and 404GG to touch sensor 10. Ground shapes 430 run parallel to axes 410A-410B, and between sense electrodes 402B and 402C and electrode connector $418_{404GG}$, respectively. Positioning ground shapes in this manner prevents capacitive coupling between sense electrodes 402B and 402C and electrode connector $418_{404GG}$.

In various embodiments, all or some adjacent drive electrodes may share bond pads. In particular embodiments, some electrodes in a first column may share bond pads with electrodes in a first adjacent column, while other electrodes in the first column may share bond pads with electrodes in a second adjacent column. In certain embodiments, adjacent drive electrodes with electrode connectors extending toward the top of illustrated touch screen 10 may share bond pads that are located in the non-touch sensitive area above the illustrated touch sensitive area. Adjacent drive electrodes with connectors extending toward the bottom of touch screen 10, as illustrated in FIG. 4A in channel 432B, may share bond pads located in the non-touch-sensitive area below the touch-sensitive area. In addition, some or all drive electrodes with electrode connectors extending toward the bottom of touch screen 10 may be coupled to tracks 414 which are routed around the periphery of touch screen 10 to a bond pad 416 located at the top of touch screen 10.

Using a single bond pad to couple multiple drive electrodes to touch sensor controller may reduce the space required for bond pads within touch sensor 10. Increased space efficiencies from a reduction in bond pads may permit an increase in the touch-sensitive area within a given device and/or may permit a decrease in the non-touch-sensitive area of a given device, both of which may be desired by touch screen users. Sharing bond pads, particularly in configurations where multiple drive electrodes are coupled to a single bond pad by one electrode connector may produce space efficiencies within the touch-sensitive area of touch screen 10, which may allow for an increased number and/or size of Reducing the number of bond pads may also reduce flex size and/or improve performance. Further, reducing the number of required bond pads may result in economic benefits.

Figure 5A:
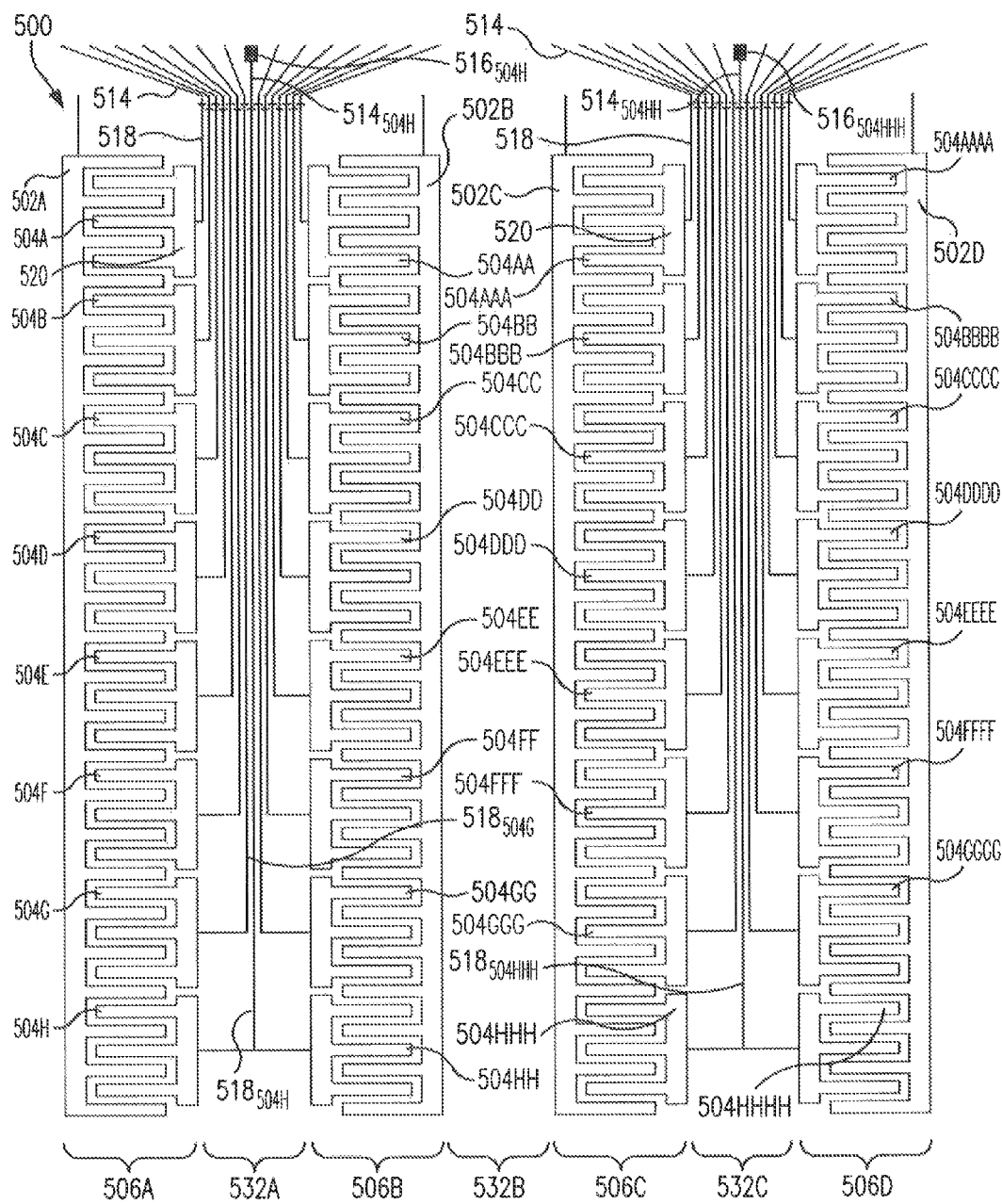
FIGS. 5A, 5B, and 5C illustrate another single-layer touch sensor configuration for use in a touch sensor in accordance with particular embodiments of the disclosure.
Figure 5B:
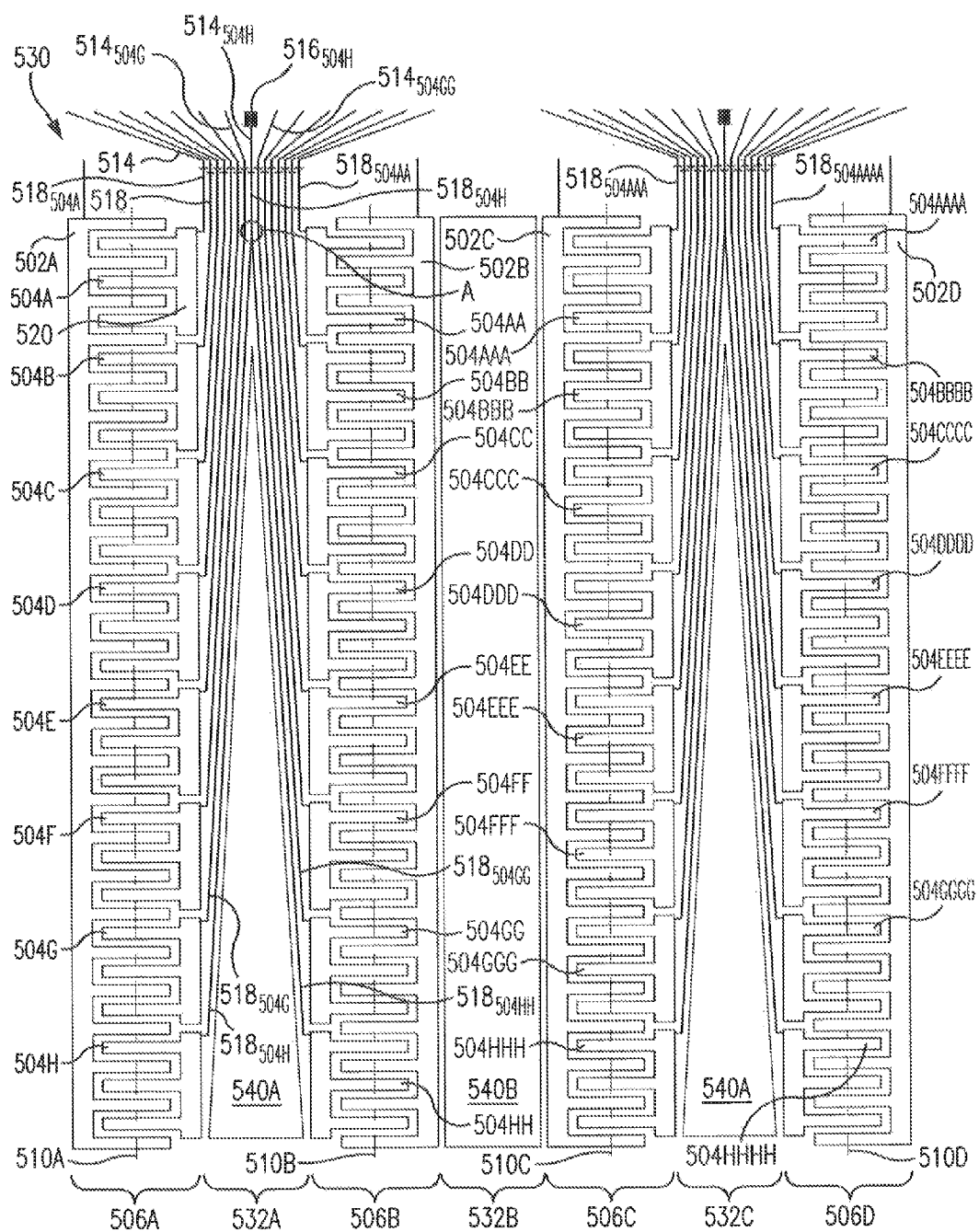
Figure 5C:
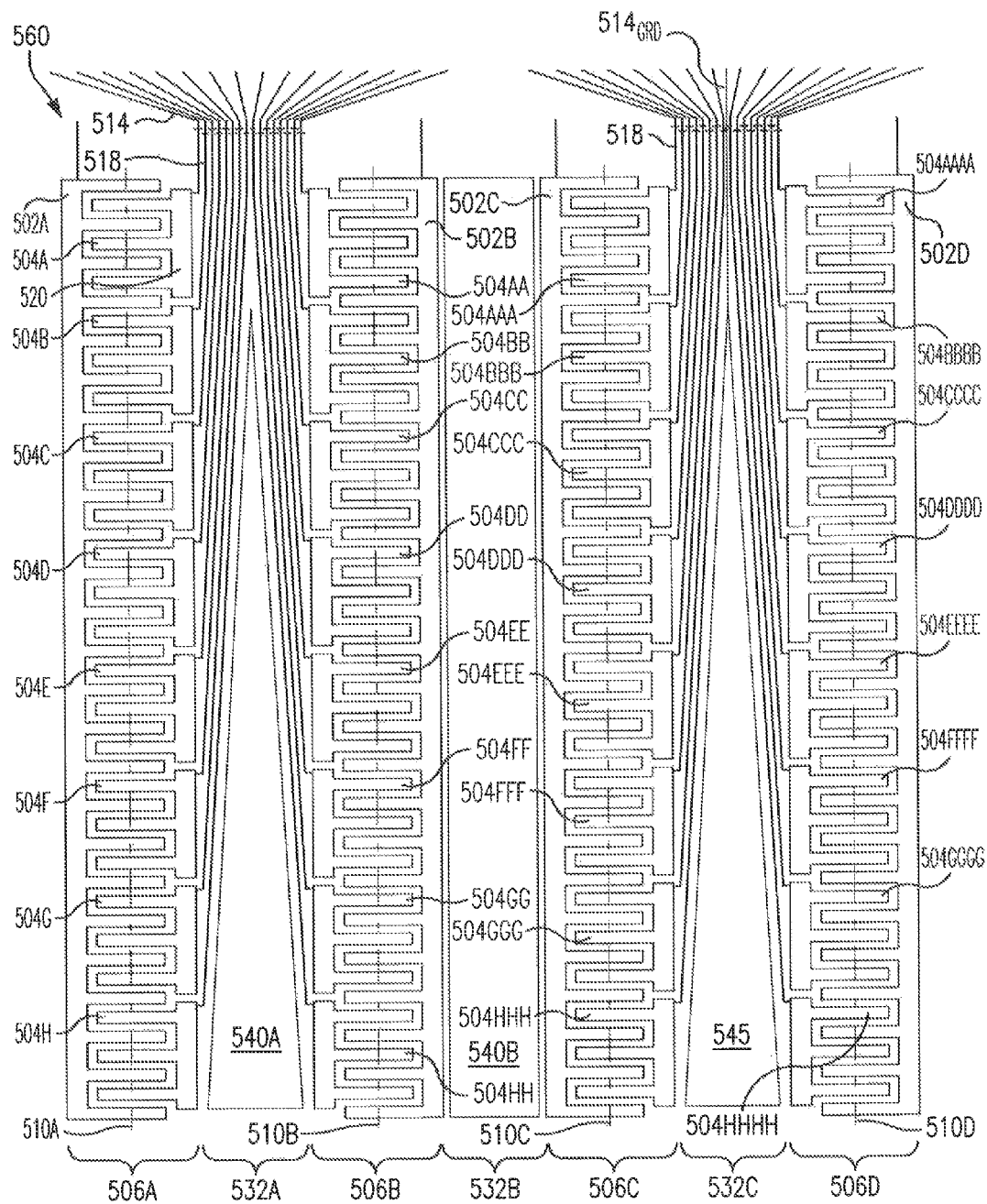

FIGS. 5A, 5B, and 5C illustrate another single-layer touch sensor configuration for use in touch sensor 10 in accordance with particular embodiments of the disclosure. FIG. 5A illustrates configuration 500, which includes an array of sense electrodes 502A-502D and drive electrodes 504A-504HHHH defining a touch-sensitive area of touch sensor 10.

Electrode connectors 518 couple drive electrodes to tracks 514. Similar to various embodiments discussed in conjunction with FIGS. 3B and 4B, drive electrodes 504H and 504HH are both connected to electrode connector $518_{504H}$. Electrode connector $518_{504H}$ couples drive electrodes 504H and 504HH to track $514_{504H}$. Track $514_{504H}$ couples drive electrodes 504H and 504HH to bond pad $516_{504H}$. Similarly, drive electrodes 504HHH and 504HHHH are both connected to electrode connector $518_{504HHH}$. Electrode connector $518_{504HHH}$ couples drive electrodes 504HHH and 504HHHH to track $514_{504HHH}$. Track $514_{504HHH}$ couples drive electrodes 504HHH and 504HHHH to bond pad $516_{504\ HHH}$. In certain embodiments, some or all of tracks 514 for drive electrodes 504AAA-504GGG may share a bond pad with tracks for adjacent drive electrodes 504AAAA-504GGGG, respectively.

Using one electrode connector rather than two electrode connectors in channel 532A to couple drive electrodes 504H and 504HH to track $514_{504H}$, and in channel 532C to couple drive electrodes 504HHH and 504HHHH to track $514_{504HHH}$ may reduce the width required for channels 532A and/or 532C. In particular embodiments, some or all of the channels in a touch screen may include one or more electrode connectors that couple multiple drive electrodes to a single track, thereby reducing the necessary width of some or all channels within a touch screen. Reducing the number of electrode connectors within a channel and/or the necessary width of a channel may also result in more sense and/or drive electrodes and/or larger sense and/or drive electrodes. Increasing the total area of drive and/or sense electrodes may improve touch screen sensitivity and performance, including, in various embodiments, possible improvements in linearity and/or accuracy.

In particular embodiments, any adjacent drive electrodes 504A-504HHHH may share an electrode connector 518. In configurations where adjacent electrodes share an electrode connector within a channel, drive electrodes below the adjacent electrodes must route electrode connectors in the opposite direction within the channel or along the periphery of the touch sensor 10. For example, in an embodiment where drive electrodes 504G and 504GG share electrode connector $518_{504GG}$, one or more electrode connectors for drive electrodes 504H and 504HH would need to be routed through the bottom of channel 532A and/or along the periphery of touch sensor 10. In particular embodiments, electrode connectors 518 may join drive electrodes at any suitable point or points along the main portions 520 of the drive electrodes. Further, the point of connection may be of any suitable width. In particular embodiments, electrode connectors are made from the same material as drive and/or sense electrodes and may be created in the same formation process. In certain embodiments, there may be electrode connectors, ground shapes, and/or floating in-fill shapes positioned within channel 532B.

FIG. 5B illustrates configuration 530, which includes an array of sense electrodes 502A-502D and drive electrodes 504A-504HHHH defining a touch-sensitive area of touch sensor 10.

Electrode connectors 518 couple drive electrodes to tracks 514. In this embodiment, $518_{504A}$, $518_{504AA}$, $518_{504AAA}$, and $518_{504AAAA}$ run generally upward from drive electrodes 504A, 504AA, 504AAA, and 504AAAA, respectively. The remaining electrode connectors 518 run in channels 532A between columns 506A and 506B, or in channel 532C between channels 506C and 506D. These electrode connectors run upwards toward the top of touch screen 10 and run at an angle with respect to axes 510A-510D. For example, electrode connector $518_{504G}$ couples drive electrode 504G to track $514_{504G}$. As electrode connector $518_{504G}$ extends from drive electrode 504G to track $514_{504G}$, rather than run along an axis parallel to 510A, it runs generally along a non-parallel line which diverges from, or is at an angle from, axis 510A. Electrode connectors for drive electrodes 504B-504F, and 504H, similarly run along a line at an angle from axis 510A. Electrode connectors for drive electrodes 504BB-504HH also run along a line which diverges from, or is at an angle from, axis 510B as the electrode connectors run from drive electrodes toward their corresponding tracks. For example, electrode connector $518_{504GG}$ couples drive electrode 504GG to track $514_{504GG}$. In this embodiment, electrode connectors for drive electrodes 504AAA-504HHH and 504AAAA-504HHHH are configured similarly in channel 532C. In various embodiments, electrode connectors 518 may or may not be configured similarly between channels. In certain embodiments, more or less electrode connectors 518 within a channel may be run at an angle versus an identified axis than illustrated in this embodiment. Further, in particular embodiments, some or all electrode connectors 518 may run at an angle versus an identified axis toward the bottom of touch screen 10.

Electrode connector $518_{504H}$ couples drive electrode 504H to track $514_{504H}$. As electrode connector $518_{504H}$ extends from drive electrode 504H to track $514_{504H}$, rather than run along an axis parallel to 510A, it runs generally along a non-parallel line which diverges from, or is at an angle from, axis 510A. Similarly, electrode connector $518_{504HH}$ couples drive electrode 504HH to track $514_{504H}$. At point A, within channel 532A, electrode connector $518_{504HH}$ merges into electrode connector $518_{504H}$. Electrode connector $518_{504H}$ thus couples both drive electrode 504H and 504HH to track $514_{504H}$; track $514_{504H}$ couples drive electrodes 504H to 504HH to a shared bond pad $516_{504H}$. In various embodiments, drive electrode 504H, drive electrode 504HH, electrode connector $518_{504H}$, and electrode connector $518_{504HH}$ are fabricated from the same material and/or created during the same formation process.

Using electrode connectors 518 at an angle within channels 532 creates larger open spaces within the channels. Floating in-fill shape 540A generally fills these spaces within channels 532A and 532C. Positioning floating in-fill shape 540A within channels 532A and 532C may allow for a flatter reference plane, may provide for more consistent sensitivity and/or may increase sensitivity across touch sensor 10. In particular embodiments, floating in-fill shape 540A may be formed from the same conductive material used to form drive electrodes and/ore electrode connectors.

Floating in-fill shape 540B fills the space in channel 532B between sense electrodes 502B and 502C. Floating in-fill shape 540B may also provide for a flatter reference plane, and/or improved touch screen sensitivity. In particular embodiments, channel 532B may also or alternately include electrode connectors and/or ground shapes.

In particular embodiments, the angles of each electrode connector in a channel may be approximately the same. In certain embodiments, the angles of various electrode connectors may be different. Further, in particular embodiments, the shape of floating in-fill shape 540A may or may not reflect the angles of one or more electrode connectors within a channel.

FIG. 5C illustrates configuration 560, which includes an array of sense electrodes 502A-502D and drive electrodes 5064A-506HHHH defining a touch-sensitive area of touch sensor 10.

Similar to configuration 530 in FIG. 5B, electrode connectors 518 couple drive electrodes 504B-504H, 504BB-504HH, 504BBB-504HHH, and 504BBBB-504HHHH to tracks 514. In particular, as electrode connectors 518 extend from drive electrode 504B-504H to tracks 514, rather than run along an axis parallel to 510A, they run generally along non-parallel lines which diverge from, or are at an angle from, axis 510A; as electrode connectors 518 extend from drive electrode 504BB-504HH to tracks 514, rather than run along an axis parallel to 510B, they run generally along non-parallel lines which diverge from, or are at an angle from, axis 510B; as electrode connectors 518 extend from drive electrode 504BBB-504HHH to tracks 514, rather than run along an axis parallel to 510C, they run generally along non-parallel lines which diverge from, or are at an angle from, axis 510C; and as electrode connectors 518 extend from drive electrode 504BBBB-504HHHH to tracks 514, rather than run along an axis parallel to 510D, they run generally along non-parallel lines which diverge from, or are at an angle from, axis 510D.

Floating in-fill shapes 540A and 540B are positioned within channels 532A and 532B. Ground shape 545 is positioned within channel 532C. Ground shape 545 is coupled to track $514_{GRD}$. Positioning ground shape 545, along with floating in-fill shapes 540A and 540B, in channels 532C, 532A, and 532B, respectively, may allow for a flatter reference plane, may provide for more consistent sensitivity and/or may increase sensitivity across touch sensor 10. Additionally or alternately, positioning ground shapes and/or floating in-fill shapes may improve the optical properties of the array, by reducing the areas with optical discontinuities. In particular embodiments, ground shape 545 may be formed from the same conductive material used to form drive electrodes and/ore electrode connectors. In certain embodiments, some or all of the floating in-fill shapes within a touch screen may be replaced with ground shapes. In various embodiments, ground shapes may or may not reflect the boundaries of adjacent electrodes and/or electrode connectors. Ground shapes may be any suitable size or shape and may be made from the same material as sense and/or drive electrodes.

Although this disclosure illustrates several configurations of touch sensor 10, these illustrations are not necessarily drawn to scale. Certain features have been exaggerated or enlarged for descriptive purposes. For example, in particular illustrations, the drive and sense electrodes may be enlarged in comparison to touch screen 10.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A touch sensor comprising:
   a plurality of first electrode lines along a first direction, each of the first electrode lines comprising a plurality of first electrodes;
   a plurality of second electrode lines along a second direction that is substantially perpendicular to the first direction, each of the second electrode lines comprising one second electrode, the one second electrode of each of the second electrode lines being interdigitated with one of the first electrodes of each of the first electrode lines, the first and second electrodes being disposed on a first side of a substrate;
   a plurality of bond pads disposed on the first side of the substrate, wherein at least one bond pad of the plurality of bond pads is coupled to at least two of the first electrodes of the plurality of first electrodes; and
   a plurality of electrode connectors that couple the plurality of first electrodes to the plurality of bond pads;
   wherein:
     a first portion of the plurality of first electrodes and one second electrode create a particular column and a second portion of the plurality of first electrodes and another second electrode create another column, the other column adjacent to the particular column;
     a first electrode connector of the plurality of electrode connectors couples a first electrode from the particular column to a first bond pad and a second electrode connector of the plurality of electrode connectors couples a first electrode from the other column to a second bond pad; and
     the first electrode connector and the second electrode connector extend from the first electrodes in a space between the particular column and the other column.

2. The touch sensor of claim 1, wherein:
   each of the first electrode lines is a drive line of the touch sensor;
   each of the first electrodes is a drive electrode of the touch sensor;
   each of the second electrode lines is a sense line of the touch sensor; and
   each of the second electrodes is a sense electrode of the touch sensor.

3. The touch sensor of claim 1, wherein at least one of the plurality of electrode connectors running between one first electrode and one bond pad at an angle to the second direction.

4. The touch sensor of claim 1, wherein each of the plurality of first electrodes and each of the second electrodes comprises an extent along the second direction and one or more projections from its extent along the first direction.

5. The touch sensor of claim 4, wherein the extents along the second direction of at least two of the plurality of first electrodes are adjacent to each other and portions of the extents along the second direction of at least two of the second electrodes are partially adjacent to each other.

6. The touch sensor of claim 1, wherein the plurality of bond pads disposed on the first side of the substrate are located along one or more edges of the touch sensor.

7. The touch sensor of claim 1, wherein:
   the at least two of the first electrodes coupled to the at least one bond pad comprise one first electrode and another first electrode; and
   one first electrode is coupled by a first track to the at least one bond pad and another first electrode is coupled by a second track to the at least one bond pad.

8. The touch sensor of claim 1, further comprising tracks along one or more edges of the touch sensor.

9. The touch sensor of claim 1, wherein at least a portion of the particular column is a mirror image of at least a portion of the other column.

10. The touch sensor of claim 9, wherein the portion of the particular column is adjacent to the portion of the other column.

11. The touch sensor of claim 1, wherein the one second electrode runs along a first side of the particular column in a first portion of the particular column and runs along a second side of the particular column in a second portion of the particular column.

12. A device comprising:
    a touch sensor comprising:
      a plurality of first electrode lines along a first direction, each of the first electrode lines comprising a plurality of first electrodes;
      a plurality of second electrode lines along a second direction that is substantially perpendicular to the first direction, each of the second electrode lines comprising one second electrode, the one second electrode of each of the second electrode lines being interdigitated with one of the first electrodes of each of the first electrode lines, the first and second electrodes being disposed on a first side of a substrate;
      a plurality of bond pads disposed on the first side of the substrate, wherein at least one bond pad of the plurality of bond pads is coupled to at least two of the first electrodes of the plurality of first electrodes; and
      a plurality of electrode connectors that couple the plurality of first electrodes to the plurality of bond pads;
      wherein:
        a first portion of the plurality of first electrodes and one second electrode create a particular column and a second portion of the plurality of first electrodes and another second electrode create another column, the other column adjacent to the particular column;
        a first electrode connector of the plurality of electrode connectors couples a first electrode from the particular column to a first bond pad and a second electrode connector of the plurality of electrode connectors couples a first electrode from the other column to a second bond pad; and
        the first electrode connector and the second electrode connector extend from the first electrodes in a space between the particular column and the other column; and
    one or more computer-readable non-transitory storage media embodying logic that is configured when executed to control the touch sensor.

13. The device of claim 12, wherein:
    each of the first electrode lines is a drive line of the touch sensor;
    each of the first electrodes is a drive electrode of the touch sensor;
    each of the second electrode lines is a sense line of the touch sensor; and
    each of the second electrodes is a sense electrode of the touch sensor.

14. The device of claim 12, wherein at least one of the plurality of electrode connectors running between one first electrode and one bond pad at an angle to the second direction.

15. The device of claim 12, wherein each of the plurality of first electrodes and each of the second electrodes comprises an extent along the second direction and one or more projections from its extent along the first direction.

16. The device of claim 15, wherein the extents along the second direction of at least two of the plurality of first electrodes are adjacent to each other and portions of the extents along the second direction of at least two of the second electrodes are partially adjacent to each other.

17. The device of claim 12, wherein the plurality of bond pads disposed on the first side of the substrate are located along one or more edges of the touch sensor.

18. The device of claim 12, wherein:
the at least two of the first electrodes coupled to the at least one bond pad comprise one first electrode and another first electrode; and
one first electrode is coupled by a first track to the at least one bond pad and another first electrode is coupled by a second track to the at least one bond pad.

19. The device of claim 12, further comprising tracks along one or more edges of the touch sensor.

20. The device of claim 12, wherein at least a portion of the particular column is a mirror image of at least a portion of the other column.

21. The device of claim 20, wherein the portion of the particular column is adjacent to the portion of the other column.

22. The device of claim 12, wherein the one second electrode runs along a first side of the particular column in a first portion of the particular column and runs along a second side of the particular column in a second portion of the particular column.

23. The device of claim 12, wherein the device is one or more of a desktop computer, a laptop computer, a tablet computer, a personal digital assistant (PDA), a smartphone, a satellite navigation device, a portable media player, a portable game console, a kiosk computer, or a point-of-sale device.

* * * * *